United States Patent
Saez et al.

(10) Patent No.: US 9,524,005 B2
(45) Date of Patent: Dec. 20, 2016

(54) DATA CENTER SERVER RACKS

(71) Applicant: W.W. Grainger, Inc., Lake Forest, IL (US)

(72) Inventors: Sigifredo J. Saez, Huntley, IL (US); Damon Boyd, Lake Forest, IL (US)

(73) Assignee: W.W. Grainger, Inc., Lake Forest, IL (US)

( * ) Notice: Subject to any disclaimer, the term of this patent is extended or adjusted under 35 U.S.C. 154(b) by 22 days.

(21) Appl. No.: 14/539,661

(22) Filed: Nov. 12, 2014

(65) Prior Publication Data

US 2015/0169012 A1   Jun. 18, 2015

Related U.S. Application Data

(60) Provisional application No. 61/903,765, filed on Nov. 13, 2013.

(51) Int. Cl.
| | |
|---|---|
| *G06F 1/00* | (2006.01) |
| *H05K 7/00* | (2006.01) |
| *G06F 1/18* | (2006.01) |
| *H05K 7/14* | (2006.01) |
| *H05K 7/20* | (2006.01) |

(52) U.S. Cl.
CPC ............ *G06F 1/181* (2013.01); *H05K 7/1491* (2013.01); *H05K 7/1492* (2013.01); *H05K 7/20736* (2013.01)

(58) Field of Classification Search
None
See application file for complete search history.

(56) References Cited

U.S. PATENT DOCUMENTS

| | | | | |
|---|---|---|---|---|
| 3,830,954 A | * | 8/1974 | Caudill | H05K 9/0018 174/362 |
| 6,320,122 B1 | * | 11/2001 | Dickey | H05K 9/0018 174/359 |
| 6,603,660 B1 | * | 8/2003 | Ehn | H04Q 1/14 174/16.1 |
| 6,627,811 B2 | * | 9/2003 | Rubenstein | G06F 1/181 174/138 E |
| 6,667,436 B2 | * | 12/2003 | Takami | H05K 9/0052 174/387 |
| 6,713,674 B2 | * | 3/2004 | Chang | H01R 13/60 174/50 |

(Continued)

*Primary Examiner* — Courtney Smith
*Assistant Examiner* — Rashen E Morrison
(74) *Attorney, Agent, or Firm* — Greenberg Traurig, LLP

(57) ABSTRACT

An example data center server rack may generally include a cabinet, a mounting fixture, and a trough. The mounting fixture may support one or more server units that are received within the cabinet. The trough may be attached to a sidewall of the cabinet. Openings in a sidewall of the cabinet may correspond to openings in a sidewall of the trough such that cables coupled to the one or more server units may be routed into the trough. The trough may include a bracket disposed between its sidewalls, with the bracket including one or more power strips. By routing the cables into the trough, the serviceability of and airflow through the data center server rack are improved. To prevent the diversion of airflow into the trough, boots may be secured at openings through which cables pass, with the boot covering a portion of the cables.

10 Claims, 5 Drawing Sheets

(56) References Cited

U.S. PATENT DOCUMENTS

| | | | | |
|---|---|---|---|---|
| 7,116,550 B2* | 10/2006 | Ewing | | H01H 85/0241 |
| | | | | 174/50 |
| 7,264,321 B1* | 9/2007 | Bueley | | A47B 47/02 |
| | | | | 312/257.1 |
| 7,994,434 B2* | 8/2011 | Benner | | H05K 9/0018 |
| | | | | 174/360 |
| 8,917,513 B1* | 12/2014 | Hazzard | | H05K 7/1498 |
| | | | | 211/153 |
| 8,969,738 B2* | 3/2015 | Ross | | G06F 1/182 |
| | | | | 174/359 |
| 2002/0012242 A1* | 1/2002 | Lecinski | | H02B 1/202 |
| | | | | 361/827 |
| 2002/0134567 A1* | 9/2002 | Rasmussen | | G06F 1/189 |
| | | | | 174/50 |
| 2003/0024717 A1* | 2/2003 | Knighten | | H01R 13/6596 |
| | | | | 174/359 |
| 2003/0024718 A1* | 2/2003 | Rubenstein | | G06F 1/181 |
| | | | | 174/359 |
| 2003/0193781 A1* | 10/2003 | Mori | | H05K 7/1489 |
| | | | | 361/725 |
| 2004/0195944 A1* | 10/2004 | Sugihara | | H05K 9/0016 |
| | | | | 312/283 |
| 2004/0227441 A1* | 11/2004 | Wang | | A47B 88/08 |
| | | | | 312/334.8 |
| 2005/0076479 A1* | 4/2005 | Rolla | | H05K 7/1449 |
| | | | | 24/302 |
| 2005/0259383 A1* | 11/2005 | Ewing | | H02B 1/306 |
| | | | | 361/622 |
| 2005/0259393 A1* | 11/2005 | Vinson | | H05K 7/20727 |
| | | | | 361/690 |
| 2008/0080159 A1* | 4/2008 | Sun | | G06F 1/182 |
| | | | | 361/818 |
| 2008/0239649 A1* | 10/2008 | Bradicich | | G06F 1/183 |
| | | | | 361/725 |
| 2009/0147944 A1* | 6/2009 | McSorley | | H05K 7/186 |
| | | | | 379/454 |
| 2009/0239460 A1* | 9/2009 | Lucia | | H05K 7/20745 |
| | | | | 454/184 |
| 2009/0273915 A1* | 11/2009 | Dean, Jr. | | G02B 6/4459 |
| | | | | 361/826 |
| 2009/0284907 A1* | 11/2009 | Regimbal | | G06F 1/181 |
| | | | | 361/679.02 |
| 2010/0206627 A1* | 8/2010 | Benner | | H05K 9/0018 |
| | | | | 174/377 |
| 2011/0244717 A1* | 10/2011 | Hsiao | | H05K 7/1492 |
| | | | | 439/527 |
| 2012/0061335 A1* | 3/2012 | Fan | | H05K 7/1488 |
| | | | | 211/26 |
| 2012/0134086 A1* | 5/2012 | Zhang | | G06F 1/181 |
| | | | | 361/679.02 |
| 2012/0134095 A1* | 5/2012 | Zhang | | G06F 1/181 |
| | | | | 361/679.33 |
| 2012/0134099 A1* | 5/2012 | Zhang | | G06F 1/184 |
| | | | | 361/679.37 |
| 2012/0211447 A1* | 8/2012 | Anderson | | H04Q 1/09 |
| | | | | 211/26 |
| 2012/0212894 A1* | 8/2012 | Henderson | | H05K 7/1489 |
| | | | | 361/679.02 |
| 2012/0293932 A1* | 11/2012 | Jai | | H05K 7/1491 |
| | | | | 361/679.02 |
| 2013/0063888 A1* | 3/2013 | Wang | | H05K 7/20736 |
| | | | | 361/679.48 |
| 2013/0120941 A1* | 5/2013 | Peterson | | H05K 7/1492 |
| | | | | 361/724 |
| 2013/0155604 A1* | 6/2013 | Lin | | H05K 7/1489 |
| | | | | 361/679.37 |
| 2013/0234575 A1* | 9/2013 | Cotton | | H05K 5/0247 |
| | | | | 312/236 |
| 2013/0299228 A1* | 11/2013 | Ross | | G06F 1/182 |
| | | | | 174/362 |
| 2014/0144852 A1* | 5/2014 | Stewart | | H05K 7/1488 |
| | | | | 211/26 |
| 2014/0146459 A1* | 5/2014 | Hazzard | | H05K 7/1498 |
| | | | | 361/679.21 |
| 2014/0369653 A1* | 12/2014 | Leigh | | G02B 6/4452 |
| | | | | 385/92 |
| 2015/0028729 A1* | 1/2015 | Frattaruolo | | H05K 5/02 |
| | | | | 312/223.1 |
| 2015/0076976 A1* | 3/2015 | Bailey | | H05K 5/023 |
| | | | | 312/223.6 |

\* cited by examiner

DATA CENTER SERVER RACKS

CROSS REFERENCE TO RELATED APPLICATION

This application is a non-provisional application claiming priority from U.S. Provisional Application Ser. No. 61/903,765, filed Nov. 13, 2013, entitled "Data Center Server Racks" and incorporated herein by reference in its entirety.

FIELD OF THE DISCLOSURE

The present disclosure relates generally to data center server racks and, more particularly, to data center server racks optimized for efficient cooling and servicing.

BACKGROUND OF RELATED ART

With the ever-increasing need for computer networks and the rapid development of computer-based technologies, market demand for server systems is rising. Some large companies use hundreds or even thousands of server units (also known as "blade servers") to accommodate a significant amount of network activity. Server units may include CPUs, RAM, and/or hard drives, as well as entire servers designed to fit on small plug-and-play cards or boards. Modern data centers oftentimes house large numbers of these server units, typically in server racks.

Further, the server racks containing the server units are typically stored in a closely spaced relation in the data centers so that server units can share power supplies, monitors, keyboards, and other electronics. Storing server units close to one another also allows technicians to service numerous server units at once. In operation, however, the densely arranged server units generate a substantial amount of heat, which must be removed to prevent overheating and malfunction of the server units and other equipment.

In one configuration known in the art, the server racks are placed in a server room of a data center with a central ventilation system that provides cooling air at least between separate rows of server racks. The drawback with this type of configuration is that the cooling air is not directed specifically at the server rack, which in turn decreases the cooling effect of the ventilation system. Thus, to maintain the server units at a desirable temperature, the system typically consumes an inordinate amount of energy.

Another cooling configuration known in the art involves fans and/or cooling systems arranged to blow air through ventilation holes in the front door of the server rack. The problem with this configuration, though, is that airflow through the server racks is usually poor. Components within the server racks, such as a multitude of cables, power strips extending orthogonally from the sidewalls of the server racks, and the server units themselves, for example, can impede the flow of air through the server rack.

Still another problem with existing server racks concerns serviceability. Technicians are required to service the contents of a server rack on occasion, such as by replacing server units, rewiring or rerouting electrical cables, or troubleshooting, for instance. However, because server racks most often contain a multitude of cables, access to any given server unit may be partially or entirely obstructed by the cables. As a result, servers that do not require servicing must be temporarily taken offline while other server units are serviced.

Another feature of existing server racks that contributes to poor serviceability and poor airflow is the structure of the power strips. Many server racks include a three-phase power strip (e.g., a three-phase power distribution unit (PDU)), as many server units nowadays require power from combinations of power phases. Current three-phase power strips typically have an A-phase at the bottom, a B-phase above the A-phase, and a C-phase at the top. Thus some server units towards the top of the server rack may require an electrical connection to the A-phase of the power strip amongst other connections, and some server units towards the top of the server rack may require at least an electrical connection to the C-phase of the power strip amongst other connections. Understandably, cables quickly become crisscrossed, further limiting access to server units within the server rack.

For at least the forgoing reasons, there is a demonstrated need to improve the cooling efficiency and serviceability of server racks.

DETAILED DESCRIPTION

Figure 1:
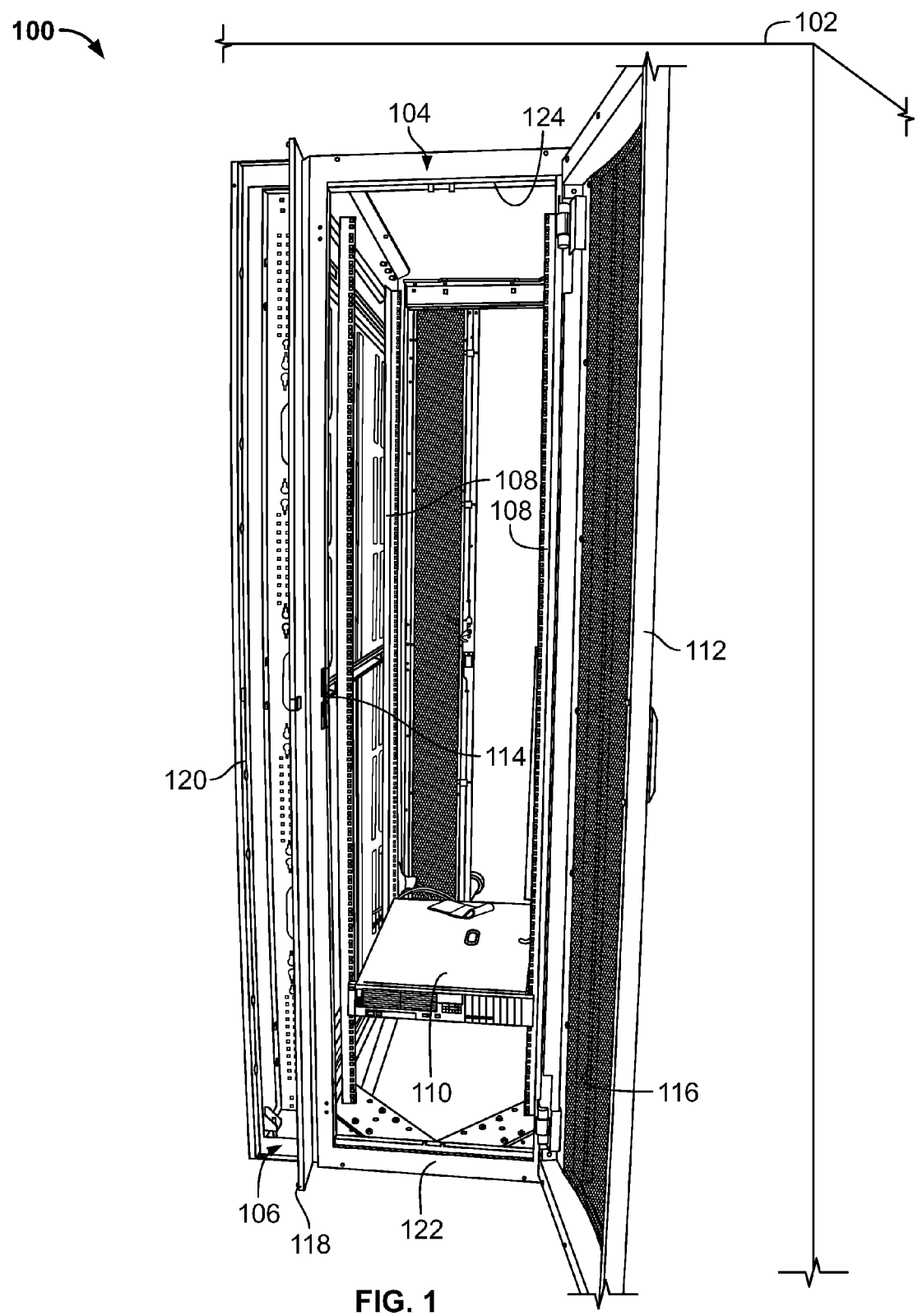
FIG. 1 is a rear view of an example data center server rack.

Disclosed is an example data center server rack that may allow server units to, among other things, be serviced more easily and that improves airflow through the data center server rack. In some examples, the server rack generally includes a cabinet having front and rear doors, opposing sidewalls, and a mounting fixture for supporting and receiving server units, as well as a trough attached to the side of the cabinet. In one example, the trough may likewise have opposing sidewalls and at least one door that is hingedly attached. In other examples, the trough does not include separate sidewalls, but rather utilizes the sidewall of the cabinet to which it is attached to form the trough compartment. In either case, the trough may further include a bracket disposed between sidewalls to which one or more power strips may be attached. Thus in some examples, the bracket creates two compartments within the trough.

In examples where the trough has its own sidewalls, the sidewalls of the trough and the cabinet that are adjacent to one another may include corresponding openings such that cables coupled to the server units may be routed into the trough. In some examples, a sidewall of the cabinet, and in some cases a sidewall of the trough, may include two columns of openings. The two columns may in some examples straddle the bracket such that one column of openings leads to a first compartment in the trough while the other column of openings leads to a second compartment in the trough. In some examples, it may be beneficial to route all data cables into one compartment and to route all power cables into another compartment, particularly the compartment containing the power strips.

To prevent airflow directed through the example server rack from being diverted through the openings of the sidewalls of the cabinet and into the trough, covers and/or boots may be used in some examples. For instance, covers may be placed in or over unused openings in the sidewall. On the other hand, for each opening through which one or more cables extend, a boot or other suitable seal may be employed to create a generally airtight seal around the cables while blocking off the remainder of the opening. A base of the boot may be secured by fasteners around the opening. The boot may comprise a seal that can be opened and closed to provide access to the opening and the cables contained therein as needed. The boot may further comprise a closure mechanism by which the boot is tightly secured around the cables. In one example, the boot may be an air sealing device similar to the air sealing device sold by Panduit Corp. In still another example, the sealing device may be a device as described in U.S. Pat. No. RE43,175 entitled "TOOLLESS, SELF CLOSING FLOOR GROMMET CLOSURE FOR CABLE OPENING AND THE LIKE IN RAISED FLOORS OF DATA CENTERS OFFICE BUILDINGS AND OTHER AIR CONDITIONED STRUCTURES," which is hereby incorporated by reference in its entirety.

Still another aspect of the present disclosure concerns the one or more power strips disposed along the bracket within the trough. In contrast to traditional power strips that have one large block corresponding to each of A-phase power outlets, B-phase power outlets, and C-phase power outlets (e.g., an upper block having all C-phase power outlets, a middle block having all B-phase power outlets, and a lower block having all A-phase power outlets), the example data center server rack may employ an example power strip wherein each block has multiple types of power outlets. For instance, each of the upper, middle, and lower blocks may include A-phase, B-phase, and C-phase power outlets. The present disclosure contemplates a number of ways in which to accomplish this objective, such as by distributing throughout the height of the trough multiple smaller power strips that each contain a different phase power outlet, for example.

The following description of example data center server racks is not intended to limit the scope of the description to the precise form or forms detailed herein. Instead the following description is intended to be illustrative so that others may follow its teachings.

Referring now to FIG. 1, an example data center server rack 100 is shown. The example data center server rack 100 may be located, for example, within a server room 102 of a data center, although the data center server rack 100 need not necessarily be located in a server room or a data center. The example data center server rack 100 shown in FIG. 1. generally includes a cabinet 104, a trough 106 affixed to a side of the cabinet 104, a mounting fixture 108 disposed within the cabinet 104 for receiving one or more server units such as an example server unit 110, a front door (not shown), and a rear door 112. At least in some examples, the example data center server rack 100 is designed to receive server units having standard measurements.

Further, the front door and the example rear door 112 are hingedly attached to the cabinet 104 in some examples and may be selectively opened and closed as needed to provide access to the example server unit 110. A striker panel 114 disposed along the cabinet 104 may engage with a latch (not shown) on the rear door 112 to secure the rear door 112 to the cabinet 104. Further, the rear door 112 and the front door may in one example include a breathable mesh design 116 that allows for a significant amount of airflow. In some examples, the example trough 106 may include a separate and/or integral door, such as an example rear door 118 for instance, that is comparable to the door of the cabinet 104, though sized accordingly. The example trough 106 may in some examples be a separate fixture that is attached to the cabinet 104 by fasteners, spot welds, or any other means known for attaching one object to another. In other examples, though, the example trough 106 may be integrated into the cabinet 104. For instance, a divider sidewall may be located within a cabinet that separates a trough from a remainder of the cabinet. Nevertheless, in the example shown in FIG. 1, a rear face 120 of the example trough 106 may be located to sit flush with a rear face 122 of the cabinet 104. However, in other examples the rear face 120 of the trough 106 may be offset from the rear face 122 of the cabinet 104 such that the trough 106 is either protruding or depressed with respect to the rear face 122 of the cabinet 104.

Those having ordinary skill in the art will appreciate that although the example data center server rack 100 of FIG. 1 is disclosed as having certain features, the present disclosure contemplates a wide variety of data center server racks—with many combinations of one or more of the disclosed features and/or features of other data center server racks not necessarily disclosed herein. For instance, the example data center server rack 100 may in some examples include a top panel 124 that promotes desirable airflow through the data center server rack 100.

Figure 2:
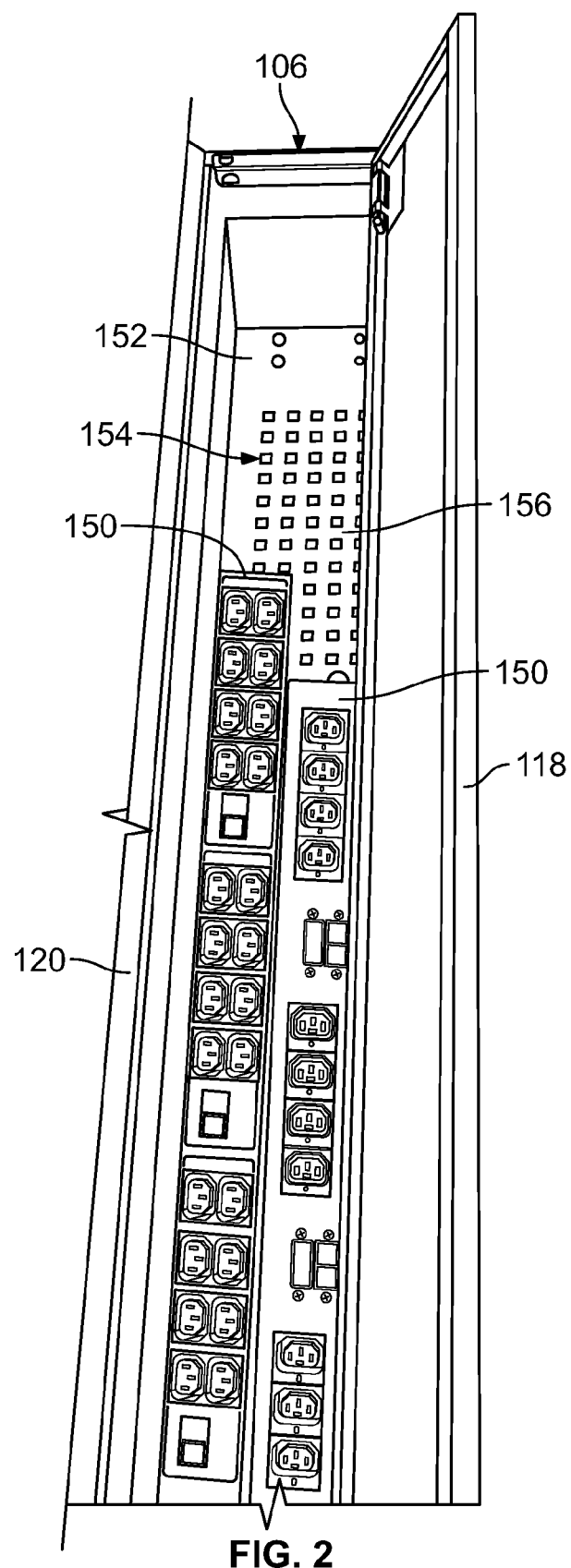
FIG. 2 is a perspective view of an example power strip disposed within an example trough affixed to a side of an example data center server rack.

FIG. 2 shows a perspective close-up view of the example trough 106 of FIG. 1. To improve the airflow through data center server racks, one or more power strips 150 may be positioned along an example bracket 152 disposed between two sidewalls (not shown) that define at least a portion of the trough 106. The example bracket 152 may be positioned deep enough in the trough 106 so as to accommodate the power strips 150 and to provide clearance for power cables and associated plugs, etc. to be routed and secured to the power strips 150. However, the example bracket 152 is not positioned so deep as to present a challenge for a technician servicing the data center server rack 100. Further, the example bracket 152 of FIG. 2 includes a grid 154 comprised of a plurality of openings 156 to which the power strips 150 may be secured. Those having ordinary skill in the art will appreciate that the bracket 152 may have a variety of features that would allow power strips to be attached to the bracket 152. Though not shown, the sidewalls of the trough 106 may include openings that communicate with corresponding openings in sidewalls of the cabinet 104. As explained below, these openings provide a path for cables extending between server units and the power strips 150. In some examples, troughs and cabinets may include openings on both sides so that rows of data center server racks may be arranged as desired. Thus troughs may be placed on either side of the cabinet, or both sides in some examples.

As explained above, many server units nowadays require power from two or more power phases, namely an A-phase, a B-phase, and/or a C-phase. Contrary to traditional power strips that have one large block for each of the A-phase, B-phase, and C-phase, the example power strips 150 in the trough 106 may in some instances have blocks having outlets corresponding to two or three of the three power phases. By way of example, one of the example power strips 150 in the trough 106 may include three blocks, with each block including at least one A-phase outlet, at least one B-phase outlet, and at least one C-phase outlet. In such examples, the need is eliminated or at least reduced for routing cables from a server unit located towards the top of the example data center server rack 100 to a bottom of the power strip 150 and vice versa. Those having ordinary skill in the art will appreciate that although the present disclosure refers to each subset of a particular power strip as a "block," the same objective may be accomplished by disposing smaller power strips having outlets for only one type of power phase at various heights throughout the trough 106. Thus each of the power strips 150 may not necessarily have two or more "blocks" corresponding to different power phases. In some examples, moreover, the two power strips 150 in the example trough 106 may be offset vertically to provide different power phases at different heights within the trough 106.

Figure 3:
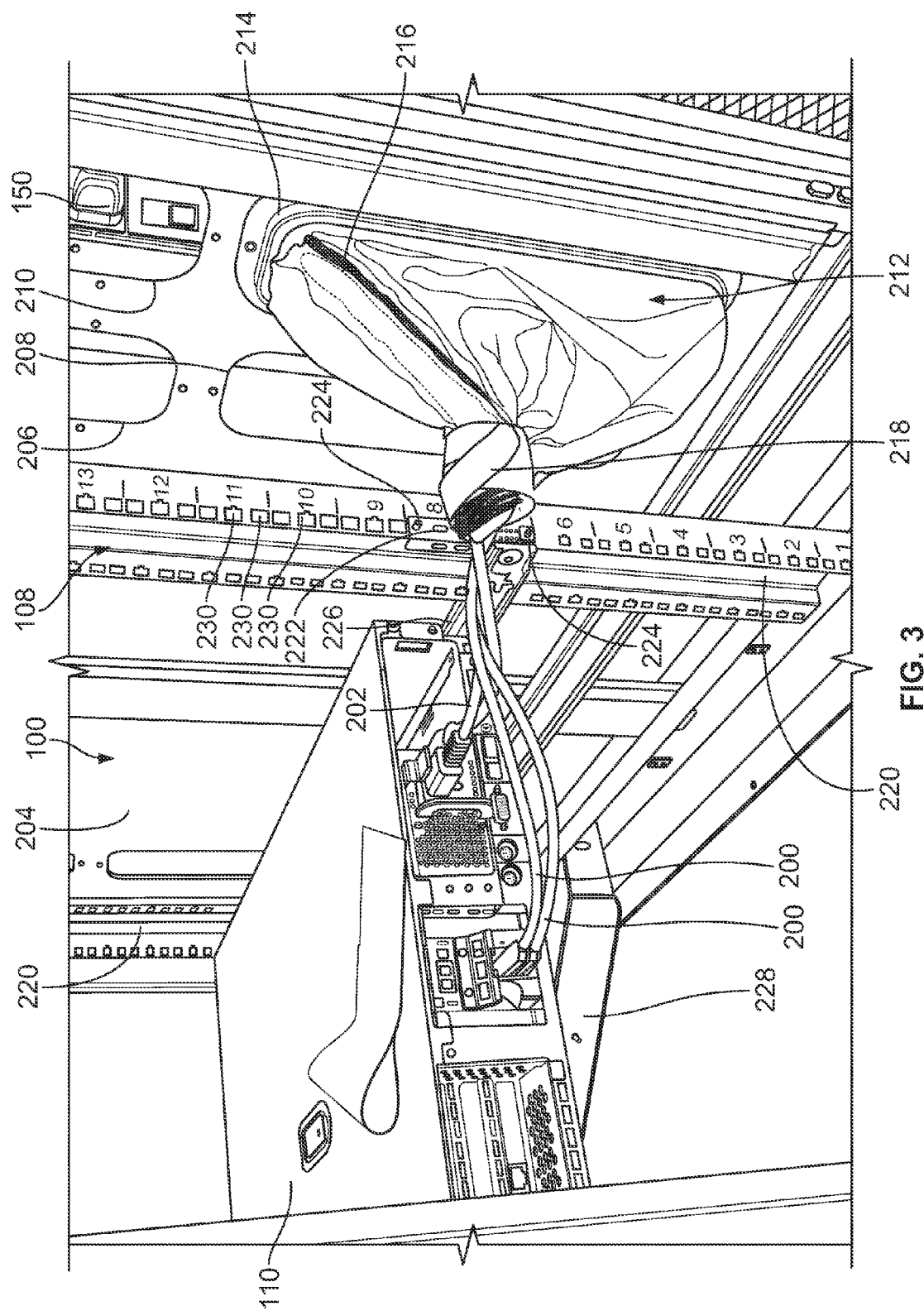
FIG. 3 is a perspective view of cables coupled to a rear of a server unit disposed within an example data center server rack, with the cables entering a trough by way of a boot affixed to a sidewall of the example server rack.

With reference now to FIG. 3, a close-up perspective rear view of the example server unit 110 is shown. The example server unit 110 is shown to have data cables 200 and a power cable 202 coupled thereto. Further, the example data center server rack 100 is shown to include an example sidewall 204, which may be adjacent to the example trough 106 shown in FIGS. 1-2. In this example, the example sidewall 204 includes at least two columns of spaced apart openings such as openings 206, 208, as well as an opening 210, all of which may communicate with the trough 106. Another opening beneath the opening 210 is concealed in FIG. 3 by a boot 212 having a base 214 that mates with the concealed opening in the sidewall 204. The data cables 200 and the power cable 202 are routed from the example server unit 110 through the boot 212, through the concealed opening in the sidewall 204 to provide access to the power strip 150.

As noted above, the example bracket 152 may be disposed along an opposing face of the sidewall of the cabinet 104, or in some cases a sidewall of the trough 106, such that the bracket 152 is positioned between the two columns of openings 206, 208, and 210. As a result, power cables may be coupled to server units and routed through one column of openings to provide access to the power strips 150, while data cables may be coupled to the server units and routed through the other column of openings for storage in a space in front of the bracket 152, with FIG. 3 being a rear view of the example data center server rack 100. In some examples another boot would be included at the opening 208, and the data cables 200 would be routed through the opening 208 as opposed to the concealed opening leading to the power strips 150. Thus while the data cables 200 may in fact be routed along with the power cable 202, this configuration is shown principally for purposes of illustration.

Those having ordinary skill in the art will appreciate that separating data cables from power cables in different compartments of the trough 106 may make servicing the data center server rack 100 easier. It should also be understand that power cables coupled to more than one server unit 110 may be routed through the same boot 212, as may data cables from more than one server unit 110.

More particularly, the boot 212 serves to prevent airflow from entering the trough 106 through openings in the sidewall 204. Diversions of airflow through such openings are disruptive to efforts to maintain the server units and/or surrounding airspace at particular operating temperatures. In some examples, the boot 212 includes an example seal 216 and an example closure mechanism 218 that may be closed and reopened as needed. When opened, the example seal 216 provides unrestricted access to the cables 200, 202 without requiring the base 214 of the boot 212 to be removed from the sidewall 204. When closed, the seal 216 prevents airflow from entering the boot 212. The example closure mechanism 218 creates a snug fit around the cables 200, 202 and likewise prevents airflow from entering the boot 212. While other boots in addition to the boot 212 may be located at other openings in the sidewall 204 such as the openings 206, 208, and 210, a boot is not necessarily needed for all of the openings in the sidewall 204 (or sidewalls) of the cabinet 204. In this case, covers may be inserted into the unused openings in some examples to prevent airflow from entering the trough 106.

With respect to the mounting fixture 108 disposed within the cabinet 104 for receiving one or more server units such as the server unit 110, the mounting fixture 108 may generally in one example include a plurality of support posts 220, one or more mounting brackets 222, a plurality of fasteners 224, a plurality of slidable rails 226, and a base 228. The base 228 and/or support posts 220 may be affixed to a remainder of the cabinet 104 at various locations and by various means. Further, in some examples the support posts 220 include positioning holes 230 for receiving fasteners 224 that secure and locate mounting brackets 222. In turn, the mounting brackets 222 can be attached to the slidable rails 226 that support the server units and allow them to slide horizontally, at least to some extent. Depending on a user's needs, dimensions of the server unit, and the type of server unit (e.g., different types of server units may require different amounts of space to maintain particular operating temperatures, etc.), the server units may be spaced apart as needed along the support posts 220.

Figure 4:
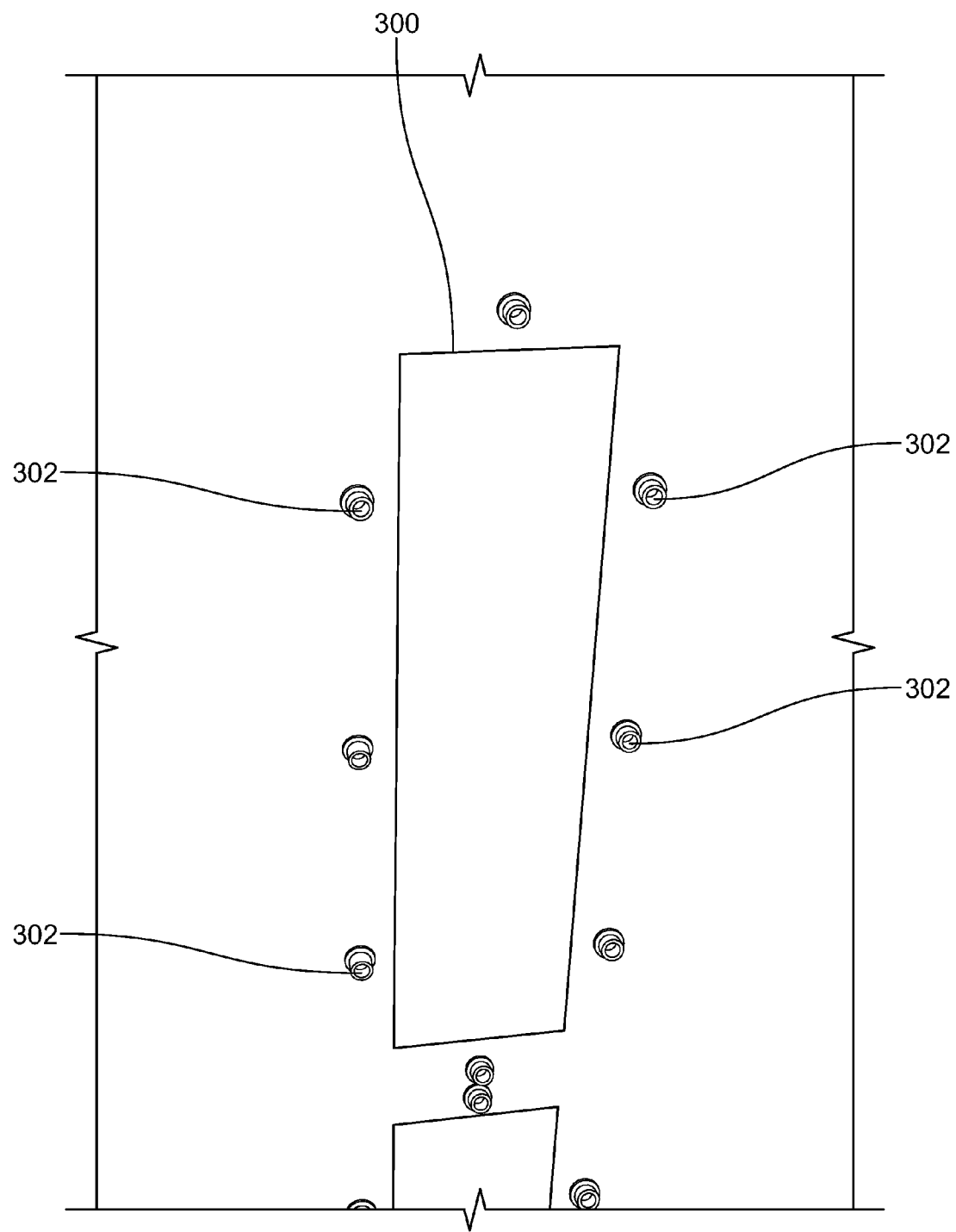
FIG. 4 is an example opening in a sidewall of a server rack for receiving cables extending from the server rack to a trough.

FIG. 4 shows another example opening 300 that may be present in the sidewalls of the cabinet 104 or the trough 106 of the example data center server room 100. As disclosed above, openings such as the example opening 300 allow cables to be routed between the trough 106 and the cabinet 104. The example opening 300 may be surrounded by a plurality of fasteners 302 for securing a cover or a boot to the sidewall of the trough 106 of the cabinet 104, as also disclosed above.

Figure 5:
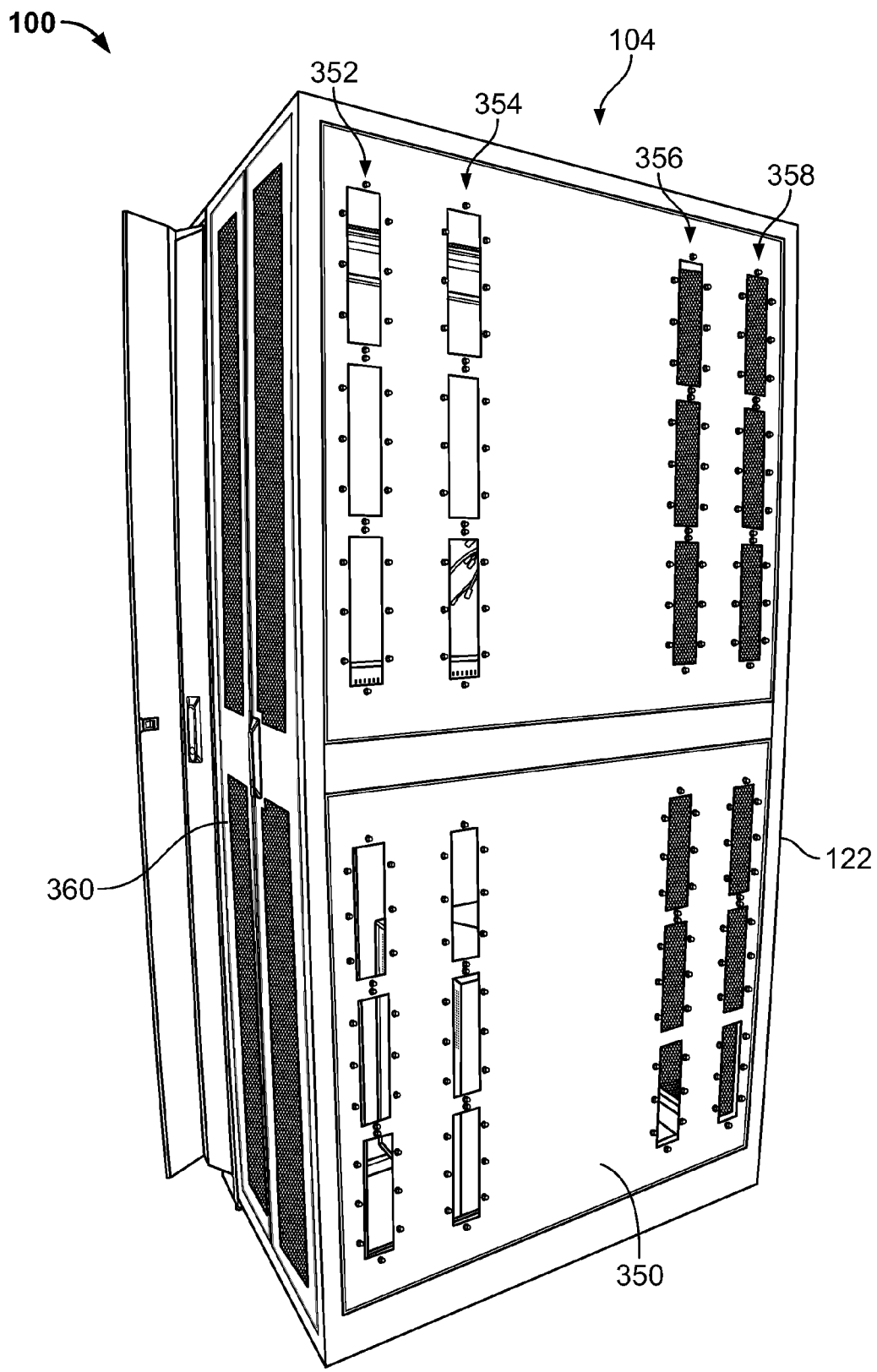
FIG. 5 is an example data center server rack, shown for purposes of illustration without a trough affixed to a side of the example server rack.

Now referring to FIG. 5, the example cabinet 104 is shown without a trough affixed to a sidewall 350. The example sidewall 350 is shown to include four columns of openings 352, 354, 356, and 358. By including the four columns 352, 354, 356, and 358, the example bracket 152 may be installed in a trough at a location towards the rear face 122 or a front face 360 of the cabinet 104. In still other examples, two brackets may be installed in a trough for added functionality or for added flexibility. Thus the column of openings 352 could provide access to power strips disposed towards a front of a trough; the columns of openings 354, 356 could provide access to a middle compartment in the trough; and the column of openings 358 could provide access to a third compartment disposed towards a rear of the trough. However, in examples where the trough has two brackets, access to the middle compartment of the trough would be limited unless the brackets in the trough were hingedly attached to a sidewall of the trough. Further, where a trough is unnecessary on an end of a row of data center server racks (e.g., two data center server racks on an end of a row may share a trough), covers may be attached to unused openings to prevent the diversion of airflow.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, while the following claims make reference to server units and cables associated with those server units for context, those having ordinary skill in the art will appreciate that the following claims do not in any way require the presence of those server units and cables.

We claim:

1. A server rack comprising: a cabinet having a vertically extending longitudinal axis and at least one door, a first sidewall, and a second sidewall, wherein the at least one door provides access to an interior of the cabinet defined by the first sidewall, the second sidewall, a back wall, a top wall, and a bottom wall, wherein the first sidewall includes a plurality of openings;
   a mounting fixture disposed in the cabinet for receiving a plurality of server units that are positionable within the cabinet;
   a first vertically extending trough adjacent an exterior of the first sidewall, the first trough including a longitudinal axis arranged parallel to the longitudinal axis of the cabinet and a trough door that provides access to an interior of the first trough, wherein the first trough defines an interior space for receiving cables from the interior of the cabinet into the interior space of the first trough through the plurality of openings in the first sidewall of the cabinet.

2. A server rack of claim 1 wherein a bracket is oriented within the first trough so as to form a first compartment and a second compartment, with the first compartment being accessible through the first door.

3. A server rack of claim 1 further comprising a plurality of openings in the second sidewall and a second vertically extending trough adjacent to the second sidewall, wherein the second trough includes a longitudinal axis arranged parallel to the longitudinal axis of the cabinet and to the longitudinal axis of the first trough, and wherein the second trough defines an interior space for receiving cables from the interior of the cabinet into the interior space of the second trough through the plurality of openings in the second sidewall of the cabinet.

4. A server rack of claim 1 further comprising at least one boot having a base secured to a portion of the first sidewall surrounding one of the plurality of openings.

5. A server rack of claim 4 wherein the at least one boot further comprises a closure mechanism that allows an opening of the at least one boot to be secured around cables passing through the at least one boot into the first trough.

6. A server rack of claim 5 wherein the at least one boot further comprises a seal extending generally between the opening of the at least one boot and the base of the at least one boot, the seal being movable between an opened configuration and a closed configuration.

7. A server rack of claim 1 further comprising a three-phase power strip disposed in the first trough, the three-phase power strip having at least an upper block and a lower block,
   wherein the upper block includes at least one A-phase power outlet, at least one B-phase power outlet, and at least one C-phase power outlet,
   wherein the lower block includes at least one A-phase power outlet, at least one B-phase power outlet, and at least one C-phase power outlet.

8. A server rack of claim 7 further comprising a bracket oriented within the first trough so as to form a first compartment and a second compartment, with the first compartment being accessible through the first door hingedly attached to the first trough.

9. A server rack of claim 8 further comprising at least one boot having a base secured to a portion of the first sidewall surrounding one of the plurality of openings.

10. A server rack of claim 1, wherein the at least one door is a mesh door.

* * * * *